(12) United States Patent
Heron et al.

(10) Patent No.: US 11,276,728 B2
(45) Date of Patent: Mar. 15, 2022

(54) MULTIFERROIC HETEROSTRUCTURES

(71) Applicants: The Regents of the University of Michigan, Ann Arbor, MI (US); Cornell University, Ithaca, NY (US)

(72) Inventors: John Thomas Heron, Saline, MI (US); Peter Benjamin Meisenheimer, Ann Arbor, MI (US); Darrell G. Schlom, Ithaca, NY (US); Rachel Steinhardt, Brooktondale, NY (US)

(73) Assignees: The Regents of the University of Michigan, Ann Arbor, MI (US); Cornell University, Ithaca, NY (US)

( * ) Notice: Subject to any disclaimer, the term of this patent is extended or adjusted under 35 U.S.C. 154(b) by 4 days.

(21) Appl. No.: 16/784,351

(22) Filed: Feb. 7, 2020

(65) Prior Publication Data
US 2021/0249468 A1    Aug. 12, 2021

(51) Int. Cl.
| | |
|---|---|
| H01L 41/20 | (2006.01) |
| H01L 27/20 | (2006.01) |
| H01L 41/47 | (2013.01) |
| H01L 41/187 | (2006.01) |
| H01L 41/12 | (2006.01) |
| H01L 41/09 | (2006.01) |

(52) U.S. Cl.
CPC ............ *H01L 27/20* (2013.01); *H01L 41/20* (2013.01); *H01L 41/47* (2013.01); *H01L 41/09* (2013.01); *H01L 41/125* (2013.01); *H01L 41/1875* (2013.01)

(58) Field of Classification Search
CPC .......... H01L 27/20; H01L 41/20; H01L 41/47
USPC .................................................. 257/183, 421
See application file for complete search history.

(56) References Cited

U.S. PATENT DOCUMENTS

| | | | | |
|---|---|---|---|---|
| 7,834,490 | B1 * | 11/2010 | Clark | H02N 2/186 310/26 |
| 8,308,874 | B1 * | 11/2012 | Clark | H01F 1/047 148/306 |
| 2006/0039092 | A1 * | 2/2006 | Gill | G11B 5/3909 360/324.2 |
| 2012/0267735 | A1 * | 10/2012 | Atulasimha | G11C 11/16 257/421 |
| 2018/0259599 | A1 * | 9/2018 | Finkel | B82Y 25/00 |

FOREIGN PATENT DOCUMENTS

WO    2017214628 A1    12/2017

OTHER PUBLICATIONS

A. Aharoni, "Demagnetizing factors for rectangular ferromagnetic prisms", J. Appl. Phys. 1998, vol. 83, No. 6, 3432.
A. E. Clark et al., "Extraordinary magnetoelasticity and latticesoftening in bcc Fe—Ga alloys", J. Appl. Phys. 2003, vol. 93, No. 10, 8621.

(Continued)

*Primary Examiner* — David Vu
*Assistant Examiner* — Brandon C Fox
(74) *Attorney, Agent, or Firm* — Lempia Summerfield Katz LLC (57) ABSTRACT

A heterostructure includes a substrate exhibiting a piezoelectric effect, and a magnetostrictive film supported by the substrate. The magnetostrictive film includes an iron-gallium alloy. The iron-gallium alloy has a gallium composition greater than 20%.

21 Claims, 5 Drawing Sheets

(56) References Cited

OTHER PUBLICATIONS

A. E. Clark, et al., "Temperature dependence of the magnetic anisotropy and magnetostriction of Fe100-xGax .x=8.6, 16.6, 28.5", McCallum, J. Appl. Phys. 2005, 97, 10M316.
B. B. Van Aken, et al., "The origin of ferroelectricity in magnetoelectric YMnO", Nat. Mater. 2004, vol. 3, pp. 164-170.
D. E. Parkes, et al., "Non-volatile voltage control of magnetization and magnetic domain walls in magnetostrictive epitaxial thin films", Appl. Phys. Lett. 2012, 101, 072402.
Das et al., "Fabrication of flexible piezoelectric PMN-PT based composite films for energy harvesting", IOP Conference Series: Materials Science and Engineering, 2017, National Conference on Processing and Characterization of Materials.
H. W. Jang et al., "Epitaxial (001) BiFeO3 membranes with substantially reduced fatigue and leakage", Appl. Phys. Lett. 2008, 92, 062910.
Hill et al., "Low temperature heat capacity of Fe1-xGax alloys with large magnetostriction", Physical Review B 77, 2008, 014430.
J. A. Mundy, et al., "Atomically engineered ferroic layers yield a roomtemperature magnetoelectric multiferroic", Nature 2016, vol. 537, 523.
J. B. Restorff et al., "Induced Magnetic Anisotropy in Stress-Annealed Galfenol Alloys", IEEE Trans. Magn. 2006, vol. 42, No. 10, 3087.
J. Lou, et al., "Giant Electric Field Tuning of Magnetism in NovelMultiferroic FeGaB/Lead Zinc Niobate-Lead Titanate (PZN-PT) Heterostructures", Adv. Mater. 2009, 21, 4711-4715.
J. Ma, et al., "Recent Progress in Multiferroic Magnetoelectric-Composites: from Bulk to Thin Films", Adv. Mater. 2011, 23, 1062-1087.
J. T. Heron, et al., "Deterministic switching of ferromagnetism at roomtemperature using an electric field", Nature 2014, vol. 516, 370.
J.-M. Hu et al., "Multiferroic Heterostructures Integrating Ferroelectric and Magnetic Materials", Adv. Mater. 2016, 28, 15.
J.-M. Hu, et al., "Electric-field control of strain-mediated magnetoelectric random access memory", J. Appl. Phys. 2010, 107, 093912.
L. Yang et al., "Bipolar loop-like non-volatile strain in the (001)-oriented Pb(Mg1/3Nb2/3)O3—PbTiO3 single crystals", Sci. Rep. 2014, 4, 4591.
M. Bibes, et al., "Towards a magnetoelectric memory", Nat. Mater. 2008, vol. 7, pp. 425-426.
M. Ciria et al., "Crystal structure and local ordering in epitaxial Fe100-xGax/MgO(001) films", J. Alloys Compd. 2018, 767, 905.
M. Ghidini et al., "Shear-strain-mediated magnetoelectric effects revealed by imaging", Nat. Mater, vol. 18, 2019, pp. 840-845.
M. Weisheit, et al., "Electric Field-Induced Modification of Magnetism in Thin-Film Ferromagnets", Science 2007, vol. 315, 5 pages.
P. B. Meisenheimer, S. Novakov, N. M. Vu, J. T. Heron, J., "Perspective: Magnetoelectric switching in thin film multiferroic heterostructures", Appl. Phys. 2018, 123, 240901.
Q. Wang, et al., "Strain-mediated 180° switching in CoFeB and Terfenol-D nanodots with perpendicular magnetic anisotropy", Appl. Phys. Letter 110, 2017, 102903.
R. Wu, "Origin of large magnetostriction in FeGa alloys", J. Appl. Phys. 2002, vol. 91, No. 10, 7358.
S. Datta et al., "Stress and magnetic field-dependent Young's modulus in single crystal iron-gallium alloys", J. Magn. Magn. Mater. 2010, 322, pp. 2135-2144.
S. Dong, et al., "Strong magnetoelectric charge coupling in stress-biased multilayer-piezoelectric/magnetostrictive composites", J Appl. Phys. 101, 2007, 124102.
S. H. Baek et al., "Giant Piezoelectricity on Si for Hyperactive MEMS", Science 2011, vol. 334, 958.
S. Manipatruni, et al. "Scalable energy-efficient magnetoelectric spin-orbit logic", Nature 2019, vol. 565, pp. 35-43.
S. Shevlin, "Multiferroics and the path to the market", Nat. Mater. 2019, vol. 18, pp. 191-192.
S. Zhang et al., "Electric-Field Control of Nonvolatile Magnetization in C040Fe40B20/Pb(Mg1/3Nb2/3_0.7 Ti0.3O3 Structure at Room Temperature", Phys. Rev. Lett. 2012, 108, 137203.
T. 吴涛 Wu et al., "Giant electric-field-induced reversible and permanent magnetization reorientation on magnetoelectric Ni/(011) [Pb(Mg1/3Nb2/3)O3]1-x-[PbTiO3]x heterostructure", Appl. Phys. Lett. 98, 2011, 262504.
T. Nan et al., "Self-Biased 215MHz Magnetoelectric NEMS Resonator for Ultra-Sensitive DC Magnetic Field Detection", Sci. Rep. 2013, 3, 1985, 6 pages.
T. Nan, et al., "Acoustically actuated ultra-compact NEMSmagnetoelectric antennas", Sun, Nat. Commun. 2017, 8, 296, 8 pages.
X. Guo et al., "Electric field induced magnetic anisotropy transition from fourfold to twofold symmetry in (001) 0.68Pb (Mg1/3Nb2/3)O3-0.32PbTiO3/Fe0.86Si0.14 epitaxial heterostructures", Appl. Phys. Lett. 2016, 108, 042403.
Y. Du et al., "Relation between Ga ordering and magnetostriction of Fe—Ga alloys studied by x-ray diffuse scattering", Phys. Rev. B 2010, 81, 054432.
Z. Ma et al., Effect of 90° domain movement on the piezoelectric response of patterned PbZr0.2Ti0.8O3 /SrTiO3 /Si heterostructures, Appl. Phys. Lett. 2005, 87, 072907.

* cited by examiner

MULTIFERROIC HETEROSTRUCTURES

STATEMENT REGARDING FEDERALLY SPONSORED RESEARCH OR DEVELOPMENT

This invention was made with government support under Grant No. HR0011-18-3-0004 awarded by the Department of Defense Advanced Research Projects Agency (DARPA), and Grant No. 70NANB17H041 awarded by National Institute of Standards and Technology (NIST). The government has certain rights in the invention.

BACKGROUND OF THE DISCLOSURE

Field of the Disclosure

The disclosure relates generally to multiferroic devices.

Brief Description of Related Technology

Magnetoelectric multiferroic composites are attractive materials for various electrically and magnetically cross-coupled devices. The multiferroic composite is capable of processing both electric and magnetic inputs. Coupling of electric and magnetic signals enables control of magnetization with electric field. One of the functions of the multiferroic component is its ability to transduce electrical energy into magnetic energy and vice versa (magnetic energy into electrical energy). The multifunctional properties of multiferroics enable the design of electronic devices for various sensing, transduction, memory and logic applications.

Magnetoelectric multiferroic materials have become intensively investigated over the past several years. These materials are capable of transducing magnetic energy to electrical energy and vice versa. In particular, artificial (or composite) multiferroics exhibit the largest transduction coefficients at room temperature. Composite multiferroics are typically bilayers formed of a ferromagnetic material with a large magnetostriction coefficient and a piezoelectric material with large piezoelectric coefficients (these are typically ferroelectric as well).

Tb—Dy—Fe alloys show the largest magnetostriction coefficients (3/2λ of about 1000-2000 ppm). Tb—Dy—Fe alloys are thus commonly the materials of choice for multiferroic applications. Unfortunately, Tb and Dy are expensive. Moreover, Tb—Dy—Fe alloys are difficult to deposit. Tb—Dy—Fe alloys are also brittle, such that device lifetimes using these alloys will be low.

In contrast, novel, rare-earth free magnetostrictive magnets, such as iron-gallium ($Fe_{1-x}Ga_x$) alloys, are earth abundant and ductile. $Fe_{1-x}Ga_x$ alloys have low magnetic anisotropy, yet show smaller magnetostriction coefficients (3/2λ of about 30-350 ppm). Unfortunately, such relatively small magnetostriction coefficients have limited the performance and adoption of $Fe_{1-x}Ga_x$ alloys.

SUMMARY OF THE DISCLOSURE

In accordance with one aspect of the disclosure, a heterostructure includes a substrate exhibiting a piezoelectric effect, and a magnetostrictive film supported by the substrate. The magnetostrictive film includes an iron-gallium alloy. The iron-gallium alloy has a gallium composition greater than 20%.

In accordance with another aspect of the disclosure, a device includes a substrate including a first surface and a second surface opposite the first surface, the substrate exhibiting a piezoelectric effect, a conductive element disposed along the first surface of the substrate, the conductive element including a magnetostrictive film, the magnetostrictive film being patterned to define a lateral extent of the conductive element, and a contact disposed along the second surface and positioned in accordance with the lateral extent of the conductive element to define a voltage across the substrate that correlates with a strain along the first surface for coupling to the conductive element. The magnetostrictive film includes an iron-gallium alloy, and wherein the iron-gallium alloy has a gallium composition greater than 20%.

In accordance with yet another aspect of the disclosure, a method of fabricating a heterostructure includes providing a substrate, the substrate exhibiting a piezoelectric effect, and growing epitaxially a magnetostrictive film, such that the magnetostrictive film is supported by the substrate, the magnetostrictive film including an iron-gallium alloy. Growing the magnetostrictive film includes supplying an iron flux and a gallium flux to the substrate such that the iron-gallium alloy has a gallium composition greater than 20%.

In connection with any one of the aforementioned aspects, the heterostructures, devices and/or methods described herein may alternatively or additionally include or involve any combination of one or more of the following aspects or features. The heterostructure further includes a buffer layer disposed between the substrate and the magnetostrictive film, wherein the buffer layer includes iron. The gallium composition is less than about 30%. The iron-gallium alloy is arranged in A2 crystalline phase. The iron-gallium alloy is single-phase. The iron-gallium alloy is arranged in single crystalline form. The substrate includes a ferroelectric material. The substrate includes (1-x)PbMg1/3Nb2/3O3-(x)Pb-TiO3. The substrate is a uniform, piezoelectric substrate. The conductive element includes a current channel of a switch arrangement such that the contact is configured to operate as a gate of the switch arrangement. The device further includes a voltage source coupled to the conductive element and configured to establish a magnetization resonance condition via the magnetostrictive film. The gallium composition is less than about 30%. The iron-gallium alloy is arranged in single-crystalline, A2 phase. The iron-gallium alloy is single-phase. The device further includes a buffer layer disposed at the first surface between the substrate and the magnetostrictive film. The buffer layer includes iron. The substrate is a uniform, piezoelectric substrate. The method further includes patterning the magnetostrictive film via an ion bombardment process, the ion bombardment process damaging an oxide layer of the magnetostrictive film, and removing the damaged oxide layer of the magnetostrictive film with an acidic solution. The method further includes depositing, on the substrate, a buffer layer on which the magnetostrictive film is grown. The gallium composition is less than about 30%. Growing the magnetostrictive film is implemented such that the iron-gallium alloy is arranged in single crystalline form. Providing the substrate includes fabricating a composite substrate, the composite substrate including a piezoelectric layer.

BRIEF DESCRIPTION OF THE DRAWING FIGURES

For a more complete understanding of the disclosure, reference should be made to the following detailed description and accompanying drawing figures, in which like reference numerals identify like elements in the figures.

The embodiments of the disclosed heterostructures, devices, and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Multiferroic heterostructures, and devices using such multiferroic heterostructures are described. Methods for fabricating such multiferroic heterostructures and devices are also described. The multiferroic heterostructures include a magnetostrictive film having an iron-gallium alloy ($Fe_{1-x}Ga_x$) with a gallium composition greater than 20%. The iron-gallium alloy may be arranged in single crystalline form. These and other aspects of the magnetostrictive film lead to improved magnetostrictive performance.

Previous low magnetostriction coefficients for iron-gallium alloys has been associated with the formation of a D03 phase. The $Fe_{1-x}Ga_x$ alloys have been deposited onto ferroelectric materials such as $BaTiO_3$ and $(1-x)PbMg_{1/3}Nb_{2/3}O_3$-$(x)PbTiO_3$ (PMN-PT). However, the $Fe_{1-x}Ga_x$ was either polycrystalline or contained the deleterious D03 phase, resulting in poor magnetoelectric transduction performance.

In contrast, the disclosed methods are capable of producing high-quality, single crystalline, pure A2 phase $Fe_{1-x}Ga_x$ films on ferroelectric materials. The iron-gallium film is thus stabilized as a chemically disordered, body-centered cubic (BCC) alloy. As a result, magnetostrictive performance is maximized for various device applications. The disclosed methods may utilize thin film epitaxy to prevent the formation of deleterious magnetostrictive phases in $Fe_{1-x}Ga_x$ alloys, thereby promoting the metastable A2 phase, which, in turn, leads to an improved magnetostriction coefficient of $Fe_{0.78}Ga_{0.22}$ films by a factor of, for instance, about 10. This enhanced magnetostriction coefficient enables the achievement of a clear 90° electrical switching of magnetic anisotropy and large room temperature magnetoelectric coefficient. The switching energy dissipation was measured at, e.g., about 5.9 µJ cm$^{-2}$, and from scaling estimates, leads to about 80 aJ per bit. This may lead to the realization of ultra-low-energy, non-volatile computational technologies and devices.

The disclosed methods achieve the epitaxial stabilization of highly magnetostrictive phase pure A2 $Fe_{1-x}Ga_x$ films with gallium compositions greater than 20%. Such gallium compositions are achieved despite the previous findings (e.g., in bulk alloys) that increasing the gallium fraction beyond 20% results in phase change. As described herein, the gallium composition of the magnetostrictive film extends to at least about 30%.

Although described in connection with PMN-PT substrates, the disclosed heterostructures, devices, and methods may utilize a wide variety of piezoelectric materials. For instance, alternative ferroelectric/piezoelectric materials are $Pb(Zr_xTi_{1-x})O_3$ (PZT), $(1-x)PbZr_{1/3}Nb_{2/3}O_3$-$(x)PbTiO_3$ (PZN-PT), $(1-x)PbMg_{1/3}Nb_{2/3}O_3$-$(x)Pb(Zr_xTi_{1-x})O_3$ (PMN-PZT), $BiFeO_3$, $Pb(In_{1/2}Nb_{1/2})O_3$—$Pb(Mg_{1/3}Nb_{2/3})O_3$—$PbTiO_3$(PIN-PMN-PT), $(K_{1/2}Na_{1/2})NbO_3$, $(1-x)(Na_{1/2}Bi_{1/2})TiO_3$-$(x)BaTiO_3$ (NBT-BT), $BaTiO_3$, $AlN$, $LiNbO_3$, $LiTaO_3$, and quartz. The substrate may or may not be ferroelectric.

The disclosed heterostructures may be used in various devices, applications and contexts involving multiferroic components. Examples of such devices include memory and logic systems, antenna systems, sensors, tunable microwave devices, highly sensitive magnetic field detectors, and nanoscale motors. Any device, system, application or context that involves the transduction of electrical energy into magnetic energy, or vice-versa, may benefit from the enhanced magnetostriction (e.g., relative to bulk) achieved by the disclosed heterostructures. A wide variety of devices may thus be realized.

Figure 1:
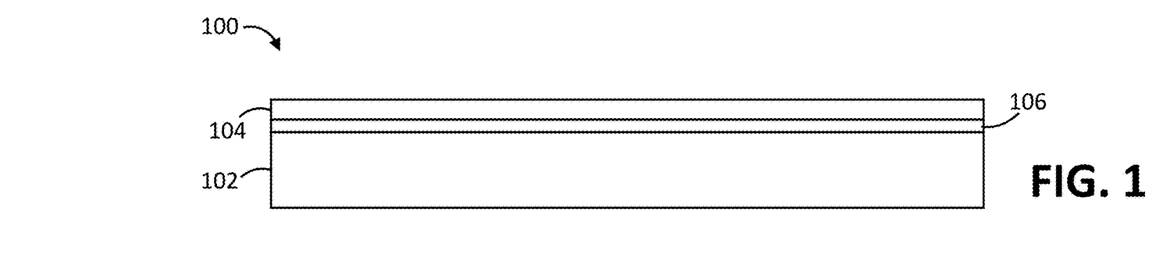
FIG. 1 is a schematic, cross-sectional view of a heterostructure having a magnetostrictive film in accordance with one example.

FIG. 1 depicts a heterostructure 100 in accordance with one example. The heterostructure 100 is configured as a multiferroic heterostructure. The heterostructure 100 includes a substrate 102 and a magnetostrictive film 104 supported by the substrate 102. The substrate 102 exhibits a piezoelectric effect, and may accordingly be referred to herein as a "piezoelectric substrate." In the example of FIG. 1, a buffer layer 106 is disposed between the piezoelectric substrate 102 and the magnetostrictive film 104. In some cases, the buffer layer 106 may act as a seed layer during epitaxial growth of the magnetostrictive film 104. The substrate, layers, and other components of the heterostructure 100 are not shown to scale, but rather depicted for ease in illustration.

The substrate 102 may be composed of, or otherwise include, a ferroelectric material. For example, the piezoelectric substrate 102 may be composed of, or otherwise include, $(1-x)PbMg_{1/3}Nb_{2/3}O_3$-$(x)PbTiO_3$ ("PMN-PT"). In such cases, the piezoelectric substrate 102 may be composed of, or otherwise include a (001)-oriented PMN-PT layer. The piezoelectric substrate 102 may alternatively or additionally include any of the materials referenced herein, as well as other piezoelectric materials. The composition of the piezoelectric substrate 102 may be selected with an interest toward providing a high piezoelectric coefficient. In one example, the piezoelectric substrate 102 has a thickness of about 1 mm, but the substrate thickness may vary considerably.

The substrate 102 may be a uniform or composite structure or substrate. For instance, in the example of FIG. 1, the substrate 102 is a uniform, piezoelectric substrate. In other cases, the substrate 102 may include a base and one or more layers supported by the base. The base may be passive (e.g., non-ferroelectric), and instead configured to provide structural support. For example, the base may be composed of, or otherwise include, silicon, silicon dioxide, mica, or a polymer material, but other crystalline or amorphous materials may be used. In such cases, any one or more of the layers may be configured to exhibit a piezoelectric effect. Any one or more of the layers may thus be composed of, or otherwise include, one of the ferroelectric materials identified above, or another material, to this end. Notwithstanding the foregoing, the term "piezoelectric substrate" is used herein to include such composite substrates regardless of the manner in which the piezoelectric effect is provided.

The magnetostrictive film 104 is composed of, or otherwise includes, an iron-gallium alloy ($Fe_{1-x}Ga_x$). The iron-gallium alloy has a gallium composition greater than 20%. The gallium composition may also be less than about 30%. In some cases, the gallium composition is about 22%. Further details regarding these and other aspects of the iron-gallium alloy are provided below.

As described herein, the magnetostrictive film 104 exhibits an improved magnetostriction coefficient despite having a gallium composition level greater than 20%. The improvements may be realized because the iron-gallium alloy remains arranged in a suitable crystalline form, i.e., a form well suited for magnetostriction. In some cases, the iron-gallium alloy is arranged in single crystalline form. As described herein, the crystalline form of the iron-gallium alloy is A2 phase. The iron-gallium alloy may be arranged as a phase pure, or single-phase, A2 film.

The magnetostrictive film 104 may be considered a thin film. As described below, the magnetostrictive film 104 may be epitaxially grown on the piezoelectric substrate 102. In one example, the magnetostrictive film 104 has a thickness of about 15 nm. The thickness of the magnetostrictive film 104 may vary based on application. For instance, the magnetostrictive film 104 may have a thickness that falls within a range from about 1 nm to about 200 nm, but other thicknesses may be used. The piezoelectric substrate 102 may have a thickness that falls within a range from about 10 nm to about 1 micron, but other substrate thicknesses may be used.

The stabilization of metastable A2 $Fe_{1-x}Ga_x$ films with x between 0.20 and 0.30 on the piezoelectric substrate 102 leads to an enhanced magnetostriction coefficient and magnetoelectric energy transduction, as described below. Moreover, the enhanced performance is achieved using inexpensive, naturally abundant materials. In contrast, other structures use magnetostrictive metals composed of rare and expensive lanthanide elements, thus making any resulting devices undesirably expensive.

When the $Fe_{1-x}Ga_x$ is deposited onto the ferroelectric or piezoelectric substrate 104, the resulting material configuration may be considered a composite multiferroic structure. One function of this material configuration involves transduction of electrical energy into magnetic energy and vice-versa (magnetic energy into electrical energy). With such transduction, the heterostructure may be used as a component of various types of devices, including, for instance, highly efficient sensors or microelectronic devices. Possible devices include memory and logic systems, antenna systems, magnetic field sensors (e.g., for defense or security applications or for monitoring traffic and parking lots), tunable microwave devices and nanoscale motors. In some cases, an electric field is applied to the ferroelectric layer to modulate the magnetic state of the $Fe_{1-x}Ga_x$ layer. In other cases (e.g., for magnetic field sensors), the magnetic field strains the ferroelectric and the resulting change in capacitance of the ferroelectric layer is measured.

The buffer layer 106 may be composed of, or otherwise include, iron. The buffer layer 106 is a thin layer, e.g., thinner than the magnetostrictive film 104. For example, the buffer layer 106 may have a thickness of less than 1 nm. In some cases, the buffer layer 106 has a thickness of about three unit cells of iron. Other thicknesses may be used. Other materials may be used, including, for instance, $SrTiO_3$, MgO, Cu, Al, and Ni. Alternative, additional, or fewer buffer layers may be used, including, for instance, an additional layer configured to act as a seed, transition, or adhesion layer.

The heterostructure 100 may include one or more layers or other elements in addition to the those shown in the example of FIG. 1. For instance, the heterostructure 100 may include a capping layer (e.g., a titanium capping layer) or other element disposed across the magnetostrictive film 104. The additional layer(s) may be passive or active. For instance, the heterostructure 100 may include one or more additional magnetostrictive films in addition to the magnetostrictive film 104.

Figure 2:
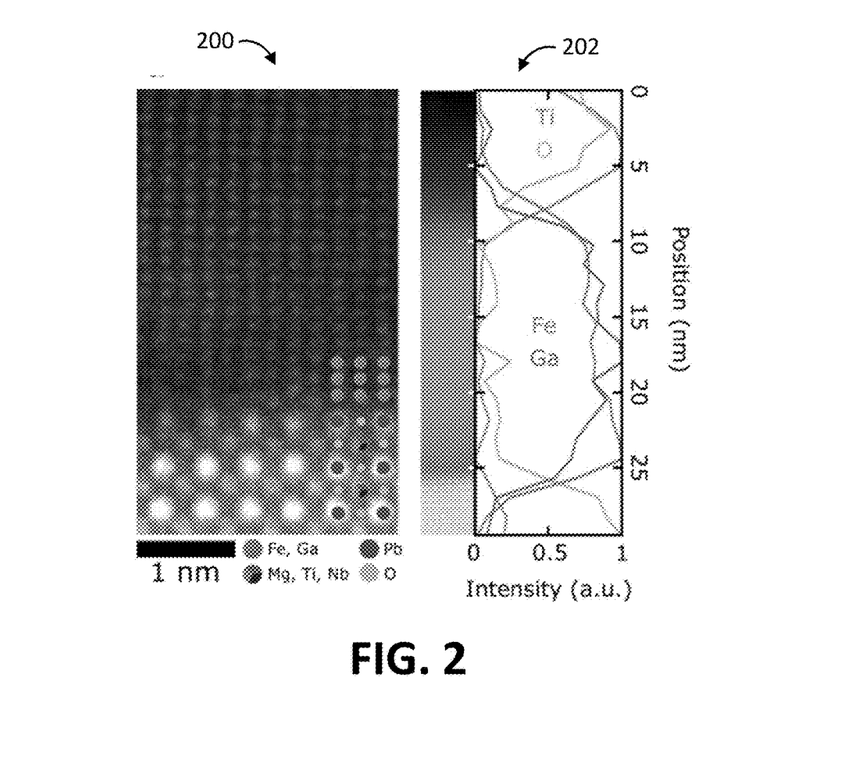
FIG. 2 is a scanning transmission electron micrograph image, along with an electron energy loss spectroscopy plot, of a magnetostrictive film in accordance with one example.

FIG. 2 depicts a transition electron microscope image 200 of an example heterostructure having a $Fe_{0.78}Ga_{0.22}$ film. In this case, the image 200 is a high-angle annular dark-field scanning transmission electron (HAADF-STEM) micrograph along the $Fe_{0.78}Ga_{0.22}$ [110] zone axis. The image 200 depicts the epitaxial interfaces along the [010]s substrate direction. As shown in the image 200, the interfaces were sharp and well ordered. The image 200 shows the single crystalline, epitaxial relationship of the film.

Electron diffraction of the heterostructure shown in the image 100 indicated that the $Fe_{0.78}Ga_{0.22}$ layer was arranged in phase pure A2 form. For instance, the 001 peaks were absent in the diffraction image, revealing phase pure A2 $Fe_{0.78}Ga_{0.22}$. Furthermore, in-situ diffraction of the $Fe_{0.78}Ga_{0.22}$ film on a ferroelectric (001) PMN-PT substrate revealed high crystallinity and epitaxial registry of the film to the substrate. X-ray diffraction of the example also confirmed that the presence of a phase pure and single crystalline $Fe_{0.78}Ga_{0.22}$ film on the PMN-PT substrate. The HAADF-STEM micrographs 200 corroborated ex situ X-ray diffraction and in situ diffraction measurements that reveal the deposition of a single crystalline, phase-pure $Fe_{0.78}Ga_{0.22}$ film on the PMN-PT substrate with a clean and coherent interface.

FIG. 2 also depicts the electron energy loss spectroscopy (EELS) 202 for the film as a function of film thickness. The spectroscopy 202 exhibits abrupt concentration edges and a nominal thickness of about 15 nm for the film. Ex situ X-ray diffraction θ-2θ data also showed a 002 peak near 65° (pure iron film peak at about 65.3°, $Fe_{0.78}Ga_{0.22}$ at about 64.7°) indicating the film has a chemically disordered body centered cubic (BCC) structure (α-Fe phase). The relative Ga:Fe concentration was measured to be 21.5±3% Ga using quantitative EELS based on Hartree-Slater inelastic cross sections. EDS measurement of 24±5% Ga corroborated this quantification.

From the HAADF-STEM images 200 along the [100]s direction (substrate direction denoted $[ijk]_s$) also shows the epitaxial orientation relationship between the $[100]_s$ PMN-PT//[110] $Fe_{0.78}Ga_{0.22}$ elements of the heterostructure. There is a 45° in-plane rotation between the $Fe_{0.78}Ga_{0.22}$ film and the PMN-PT substrate from a cube-on-cube orientation relationship, which was further confirmed by XRD φ scans.

Figure 3:
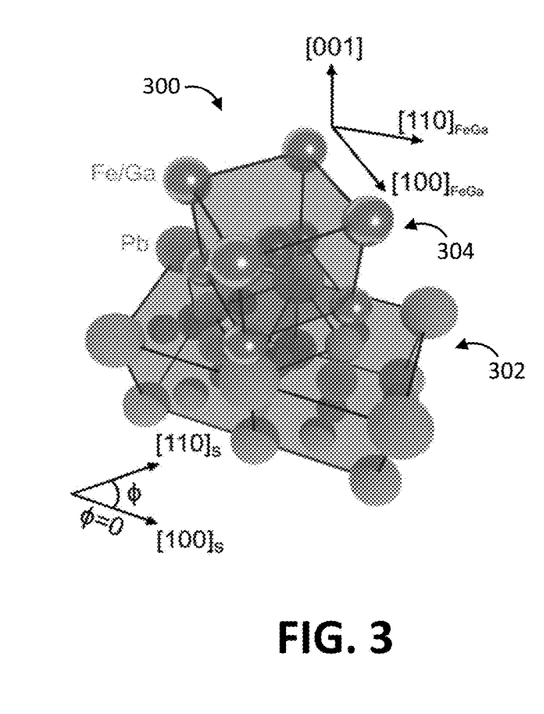
FIG. 3 is a schematic, atomic diagram of a heterostructure having a PMN-PT substrate in accordance with one example.

FIG. 3 schematically depicts the epitaxial orientation relationship. In this case, a heterostructure 300 includes a PMN-PT substrate 302 and an iron-gallium film 304. The iron-gallium film 304 may be, for example, $Fe_{0.78}Ga_{0.22}$. As shown in FIG. 3, the iron-gallium film 304 has an orientation normal to the interface, which is the [001] direction.

Figure 4:
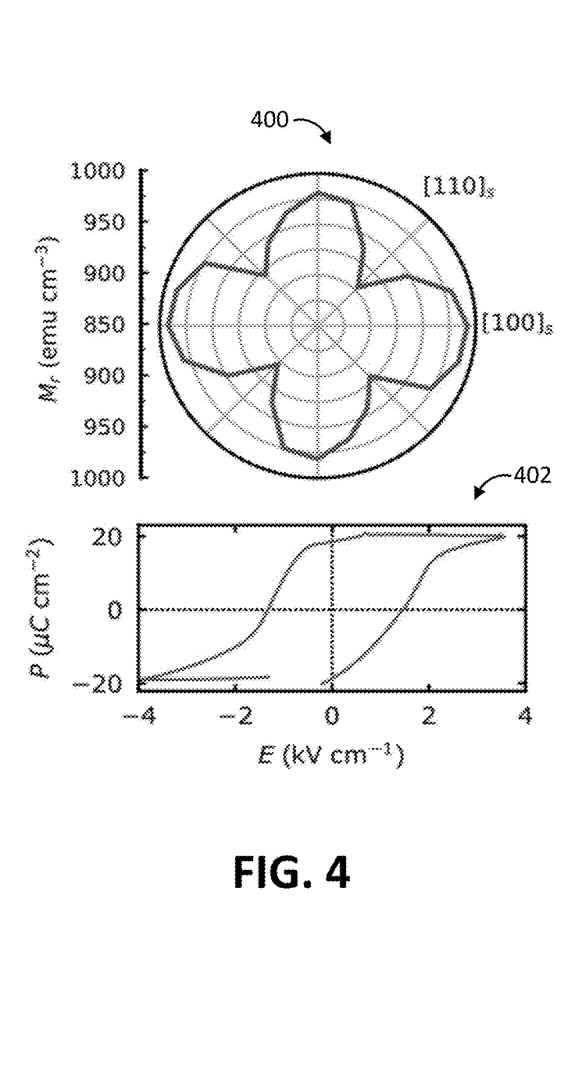
FIG. 4 depicts graphical plots of magnetization and ferroelectric polarization of a heterostructure in accordance with one example.

FIG. 4 depicts a graphical plot 400 of remanent magnetization as a function of crystallographic direction for a heterostructure in accordance with one example. The plot 400 shows room-temperature magnetometry with four-fold symmetry for the magnetic easy axis along the substrate [100]s directions corresponding to the [110] directions of the film. The remanent polarization was measured at 20.4 $\mu C$ $cm^{-2}$.

FIG. 4 also depicts a graphical plot 402 of ferroelectric polarization as a function of electric field for the magnetoelectric composite structure in accordance with one example. The measurements depicted in the plot 402 also show saturation at about 3 $kV\ cm^{-1}$. The coercive field was measured at 1.46 $kV\ cm^{-1}$. Additionally, the example heterostructure saturated with a magnetization of 980 emu $cm^{-3}$, corresponding to an estimated gallium concentration of about 23%. This concentration is beyond the formation threshold of the ordered $Fe_{0.78}Ga_{0.22}$ intermetallic phase, yet no evidence of ordering is exhibited, implying epitaxy may be playing a useful role in stabilization of the disordered phase.

Thin-film deposition may allow metastable phases to be realized through epitaxy, allowing the promotion of the chemically disordered BCC (A2) phase in the iron-gallium film at high (e.g., 23%) gallium concentrations. In bulk, the magnetostriction coefficient of $Fe_{1-x}Ga_x$ alloys versus gallium composition peaks near about 18% Ga. This is due to a phase change from the disordered A2 phase to an ordered BCC phase ($DO_3$, which reduces the magnetostriction coefficient. The signature of this $DO_3$ phase is a 001 BCC diffraction peak, yet in the epitaxial iron-gallium films of the disclosed heterostructures, no 001 superlattice peaks were observed, e.g., for the $Fe_{0.78}Ga_{0.22}$ layer in X-ray diffraction or selected area electron diffraction data. This suggests that internal strain due to epitaxy can be used to stabilize the A2 phase with gallium compositions above 20%.

Figure 5:
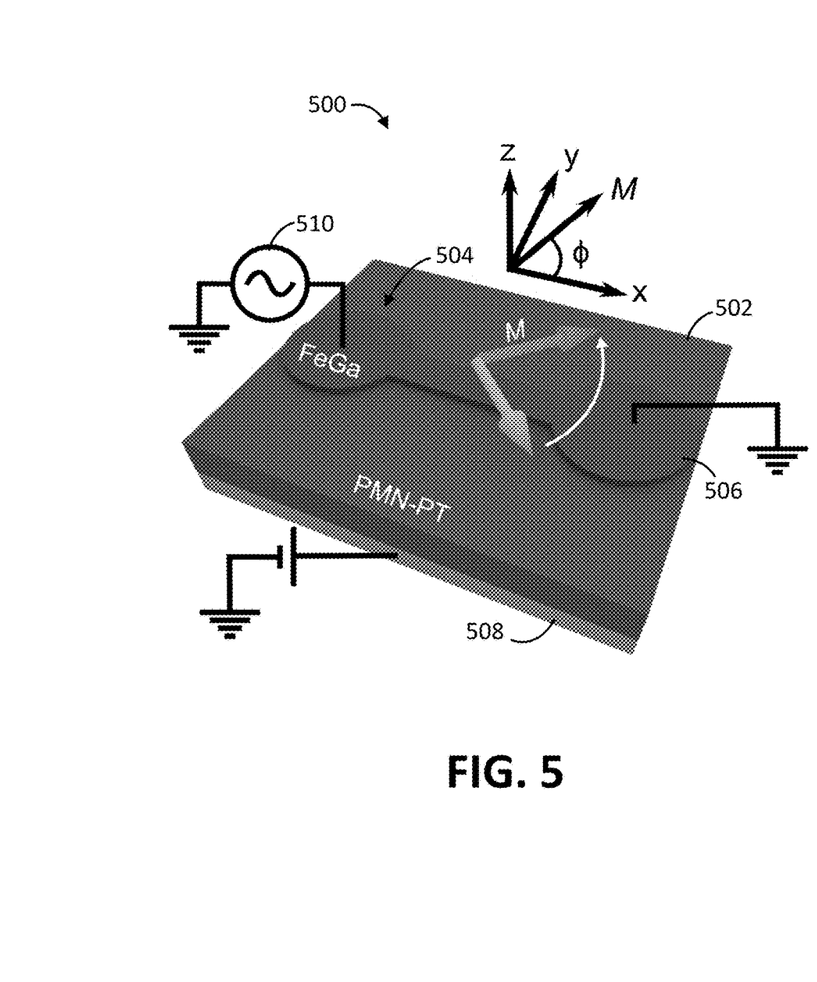
FIG. 5 is a schematic, perspective view of a device (e.g., switching device) having a heterostructure component in accordance with one example.

FIG. 5 schematically depicts a device 500 in accordance with one example. The device 500 may be a magnetoelectric multiferroic device or system. For example, the device 500 may be configured as, or otherwise include, a memory device, a magnetic field sensor, or other device utilizing or exhibiting magnetoelectric characteristics. The magnetoelectric characteristics of the device 500 may be provided via a heterostructure having an iron-gallium alloy as described herein. For instance, in one example, the device 500 includes a $Fe_{0.78}Ga_{0.22}$/PMN-PT heterostructure, but other iron-gallium films and piezoelectric substrates may be used.

In the example of FIG. 5, the device 500 includes a piezoelectric substrate 502. The piezoelectric substrate 502 may have a composition and be otherwise configured as described herein. The piezoelectric substrate 502 includes a top surface along which a conductive element 504 is disposed. The conductive element 504 includes a magnetostrictive film 506. The magnetostrictive film includes an iron-gallium alloy with a gallium composition greater than 20%. The iron-gallium alloy may be configured, and the gallium composition may vary, as described herein. For instance, the iron-gallium alloy may be arranged in single-crystalline, A2 phase. The device 500 may include one or more other heterostructure elements, including, for instance, a buffer or other layer as described herein.

Disposed along a bottom surface of the piezoelectric substrate 502 is a contact 508. In some cases, the contact 508 is configured to act as, or otherwise include, a gate or other input electrode for the device 500. In the example of FIG. 5, a bias voltage is applied (e.g., selectively applied) to the contact 508. In other cases, the contact 508 may act as an output electrode. For instance, the contact 508 may be used to capture a voltage developed across the piezoelectric substrate 502 in a device configured to sense a magnetic field.

The magnetostrictive film 506 is patterned to define a lateral extent of the conductive element 504. The contact 508 may be positioned in accordance with the lateral extent of the conductive element 504 to define a voltage across the piezoelectric substrate 502. The voltage across the piezoelectric substrate 502 correlates with a strain along the top surface of the piezoelectric substrate 502 for coupling to the conductive element 504.

In one example, in operation, a voltage is applied across the piezoelectric substrate via the contact 508. The conductive element 504 may thus act as a ground or other node. A voltage across, or resistance along, the conductive element 504 may then be measured via a voltmeter or other circuit or circuit element 510. The voltage or resistance varies as a function of magnetic field strength and direction ($\phi$) in accordance with the magnetostriction provided by the film 506 via the bias voltage.

In some cases, the conductive element 504 is configured as, or otherwise includes, a current channel of a switch arrangement. In such cases, the contact 508 may be configured to operate as a gate of the switch arrangement.

In the example of FIG. 5, the channel (or other central) portion of the conductive element 504 is shaped as a bar. The bar terminates at a pair of electrodes, which may be sized and/or shaped to accommodate electrical connections. A wide variety of other shapes may be used for the channel and other portions of the conductive element 504.

In some cases, the circuit or circuit element 510 is configured as, or otherwise includes, a voltage source. The voltage source is coupled to the conductive element 504 to apply a time-varying or other voltage to the magnetostrictive film 506. For example, the voltage may be configured to establish a magnetization resonance condition via the magnetostrictive film 506.

Figure 6:
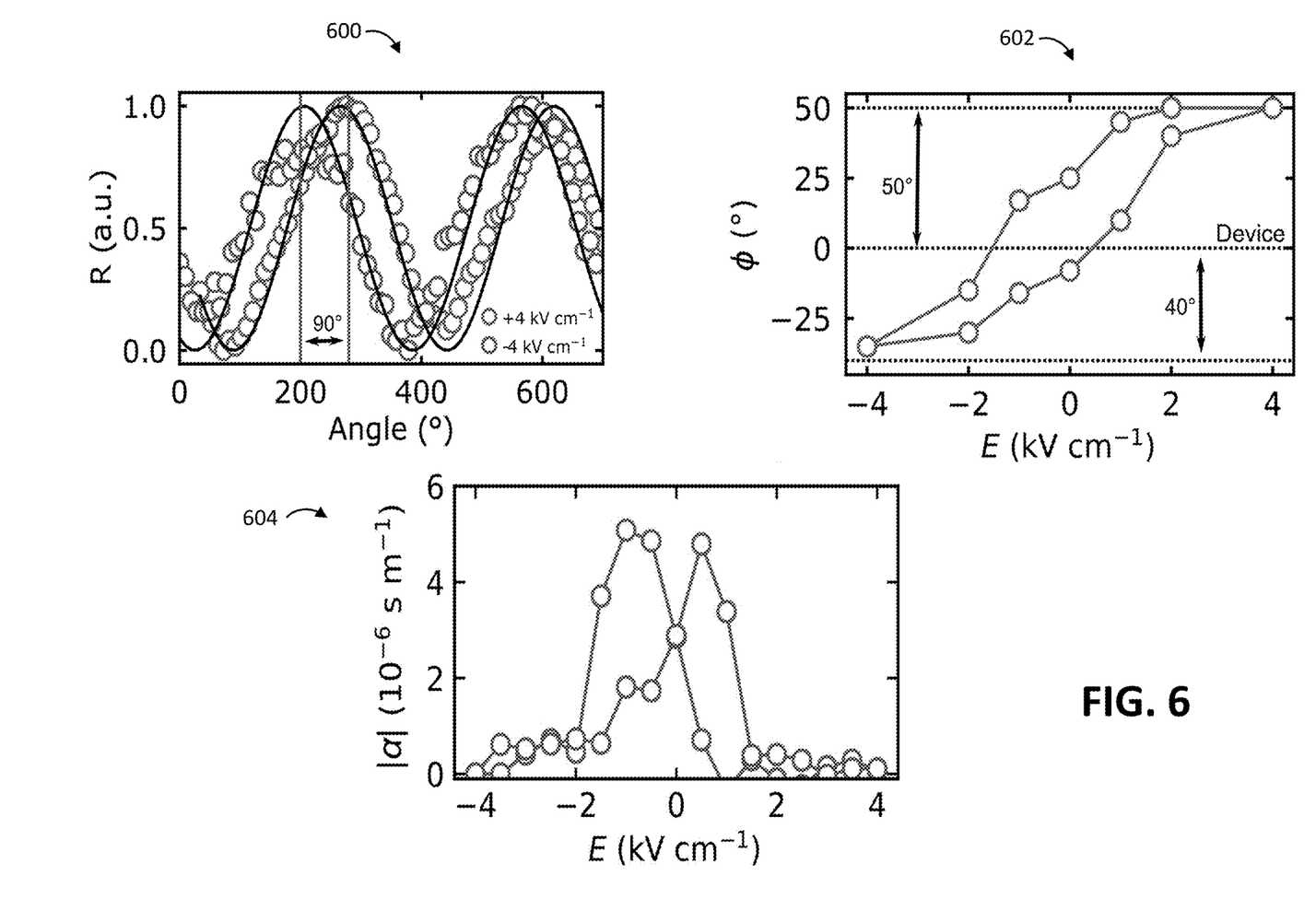
FIG. 6 depicts graphical plots of resistance curves, anisotropy axis direction, and converse magnetoelectric coefficient of a switching device having a heterostructure component in accordance with one example.

FIG. 6 depicts a number of graphical plots 600, 602, 604 of the performance of an example of the device depicted in FIG. 5. Anisotropic magnetoresistance (AMR) measurements were carried out as a function of angle and magnetic field to determine the direction of the magnetization and magnetic anisotropy. The plot 600 shows low-field (e.g., 50 Oe) AMR curves taken under an electric field of ±4 kV $cm^{-1}$, plotting normalized resistance as a function of angle. Fits to sin(2θ) are shown in solid lines. The two saturated polarization states of the ferroelectric correspond to a 90° phase shift in the curve, showing a 90° separation of magnetization directions, i.e., a 90° switching of magnetization. When saturated, the magnetization lies approximately 45° from the current direction, meaning the magnetization is pulled along the $[110]_s$ direction. This is the hard axis of the as-grown $Fe_{0.78}Ga_{0.22}$ layer, indicating that the magnetization direction is dominated by an external voltage-controlled anisotropy.

The plot 602 depicts the direction of the magnetization, i.e., the anisotropy axis, relative to the x-direction, as a function of electric field, extracted from the curves in the plot 600. Hysteretic behavior in the magnetization, saturating at approximately ±3.5 kV cm$^{-1}$ is achieved. The shift in angles is due to the approximate 5° misorientation of the lithographic patterning of the Fe$_{0.78}$Ga$_{0.22}$ device from the [100]s.

A full 90° anisotropy switching is observed between the saturation tails observed at ±4 kV cm$^{-1}$. Relative to the direction of applied current (along 0°~[100]$_s$), however, the anisotropy direction becomes fully saturated at about ±45° ([110]S and [1$\overline{1}$0], directions). Based on this measurement, the non-volatile ferroelastic strain from the substrate is oriented along [110]$_s$ and [110]$_s$ directions, depending on the applied voltage, and is strong enough to overcome the intrinsic anisotropy barrier of the iron-gallium alloy (e.g., Fe$_{0.78}$Ga$_{0.22}$).

The plot 604 depicts the converse magnetoelectric coefficient ($|\alpha|$) calculated from high-field AMR data. The coefficient reaches a maximum value of approximately 5.5×10$^{-6}$ s m$^{-1}$ during switching.

Figure 7:
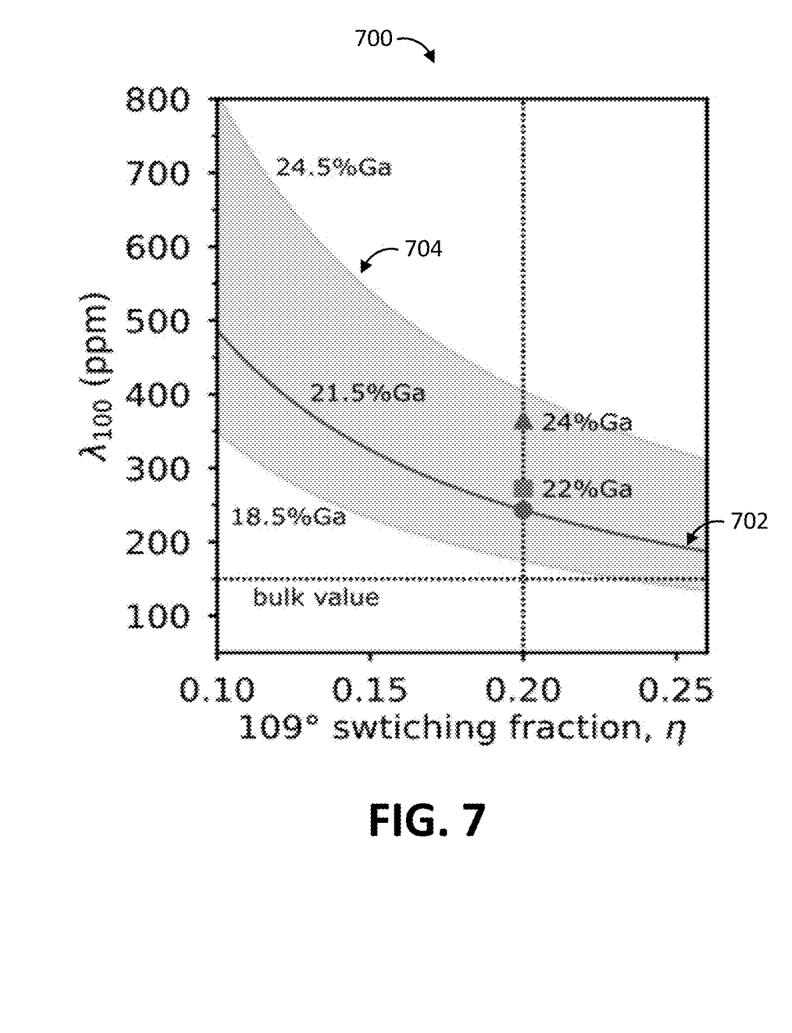
FIG. 7 is a graphical plot of magnetostriction coefficients for several examples of magnetostrictive films.

FIG. 7 depicts a graphical plot 700 of calculated converse magnetostriction coefficient of devices including a Fe$_{0.78}$Ga$_{0.22}$ film. Coefficient values are plotted as a function of ferroelectric domains undergoing 109° switching. The $\lambda_{100}$ coefficient values were determined through a linear interpolation of stiffness tensor elements, $$\frac{c_{11} - c_{12}}{2}.$$

Composition is determined from EELS data indicated by a solid line 702. An area 704 is indicative of the error. Other markers correspond to compositions determined using EDS (triangle, 24%) and saturation magnetization (square, 23%), which all lie within the error bounds. The magnetostriction of the bulk single crystal is shown as a horizontal dashed line and the vertical dashed line represents the values for η.

Figure 8:
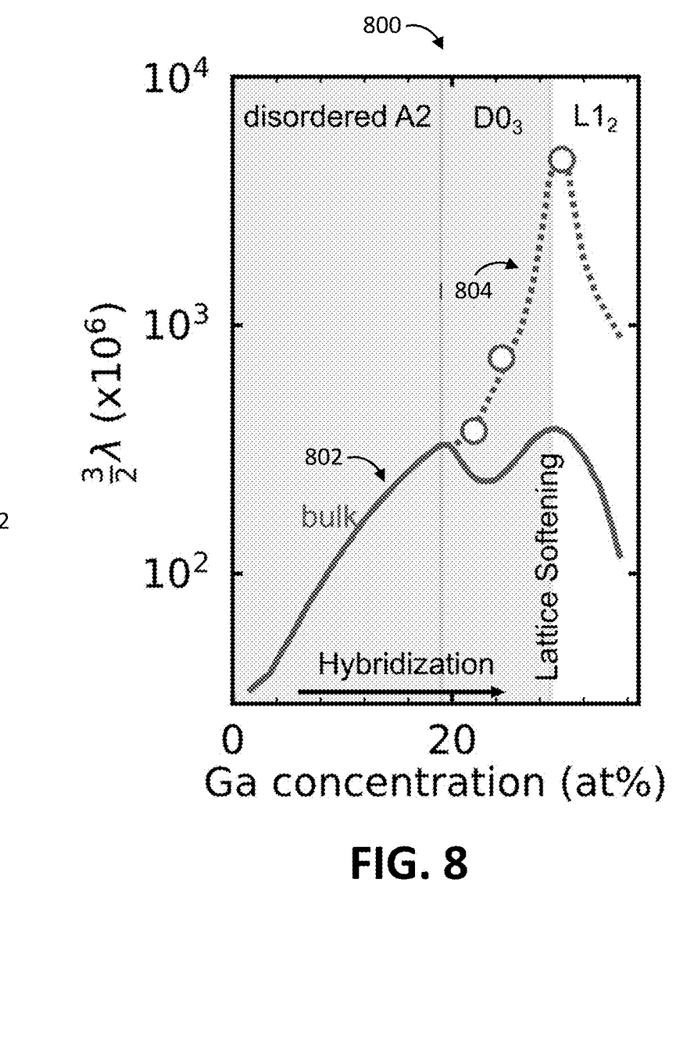
FIG. 8 is a graphical plot of magnetostriction coefficients as a function of gallium composition for comparison of bulk samples and examples of heterostructures having a magnetostrictive film.

FIG. 8 depicts a graphical plot 800 of magnetostriction coefficients as a function of gallium concentration (or composition) for bulk and thin film structures. Solid line 802 represents magnetostriction coefficients realized in bulk structures. Dashed line 804 represents magnetostriction coefficients realized in thin film samples, such as the films described herein. Several data points are provided, between which coefficients are extrapolated as shown via the dashed line 804. As shown in the plot 800, the realized magnetostriction coefficients continue to improve for films having concentration levels greater than 20%, unlike the bulk structures. The improvement in realized magnetostriction coefficient continues until the gallium concentration reaches a level less than about 30%. The suppression of the deleterious phases that appear in bulk structures results in an approximate doubling of the magnetostriction coefficient in the phase pure A2 Fe$_{0.78}$Ga$_{0.22}$ films of the heterostructures described herein.

Figure 9:
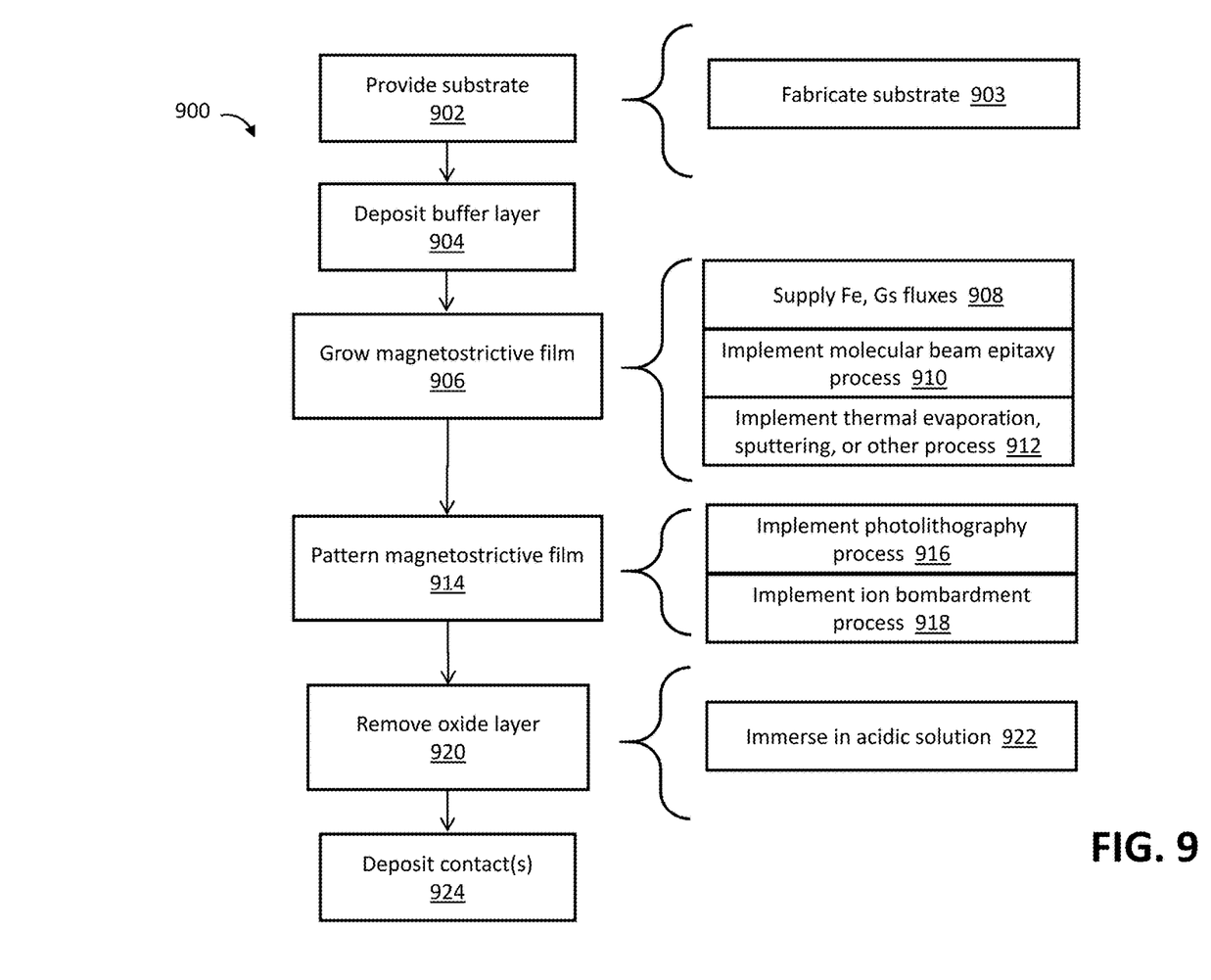
FIG. 9 is a flow diagram of a method of fabricating a heterostructure in accordance with one example.

FIG. 9 depicts a method 900 of fabricating a heterostructure or device including a heterostructure. The heterostructure may have one or more elements, aspects, or features in common with the heterostructures described above. The method 900 may thus be used to fabricate any of the heterostructures or devices described herein, and/or another heterostructure or device.

The method 900 may begin with an act 902 directed to providing a substrate, such as a piezoelectric substrate. Regardless of composition, the substrate exhibits a piezoelectric effect as described herein. In some cases, the act 902 includes an act 903 in which the substrate is fabricated. The substrate may thus be fabricated as a composite substrate including a base and one or more piezoelectric layers. Any number of layers may be included. The nature of the fabrication process(es) may vary accordingly. In other cases, the substrate is provided as a uniform (e.g., bulk) piezoelectric substrate.

The act 902 may alternatively or additionally include one or more processes directed to preparing the piezoelectric substrate, including preparations for subsequent processing. For example, the piezoelectric substrate may be heated to a temperature suitable for epitaxial growth and/or other deposition procedures. In one example, the substrate is heated to about 160 degrees Celsius, but other temperatures may be used.

The substrate, including any base, layer or other element thereof, may be configured in accordance with any one of the examples described herein. Alternatively, a different substrate may be provided.

In the example of FIG. 9, the method 900 includes an act 904 in which a buffer layer is deposited on the substrate. A variety of different deposition techniques may be used, including, for instance, molecular beam epitaxy (MBE), thermal evaporation, sputtering, and pulsed laser deposition (PLD). The buffer layer may be an atomically thin layer of iron as described herein. Alternative or additional layers may be deposited as described herein.

In an act 906, a magnetostrictive film is grown epitaxially. The magnetostrictive film is thus supported by the piezoelectric substrate. In some cases, the iron buffer or other layer deposited in the act 904 acts as a seed layer for the epitaxial growth. As described above, the magnetostrictive film includes an iron-gallium alloy.

The act 906 includes an act 908 in which an iron flux and a gallium flux are supplied to the piezoelectric substrate such that the iron-gallium alloy has a gallium composition greater than 20%. The gallium composition may vary as described herein. In some cases, the iron flux and the gallium flux involve elemental sources. In one example, the fluxes for the elemental sources fall in the following ranges—from about 1 to about 2.7×10$^{13}$ Fe atoms/cm$^2$-s, and from about 0.2 to about 0.6×10$^{13}$ Fe atoms/cm$^2$-s, but other flux levels may be used.

The growth in the act 906 may involve deposition of iron and gallium in a vacuum at a desired growth temperature. For example, the act 906 may utilize a deposition chamber equipped with a heater (e.g., a ultraviolet heater (UVH)) to heat the piezoelectric substrate to the desired growth temperature before supplying the iron flux and the gallium flux. In some cases, the act 906 is or otherwise includes implementation of an MBE process in an act 910. Other vacuum deposition procedures or systems may be implemented in an act 912, including, for instance, thermal evaporation, sputtering, and pulsed laser deposition (PLD). Use of such deposition procedures allows the magnetostrictive film to include an iron-gallium alloy arranged in single crystalline, pure A2 phase, as described herein.

The method 900 includes an act 914 in which the magnetostrictive film is patterned. The patterning may include implementation of one or more photolithography procedures (act 916) and implementation of one or more ion bombardment procedures (act 918). For example, the ion bombardment procedure may use an argon ion mill apparatus.

The ion bombardment process may result in damage to an oxide layer of the magnetostrictive film. In such cases, the method 900 may include an act 920 in which the damaged oxide layer of the magnetostrictive film is removed with an acidic solution. For example, the heterostructure may be immersed in an HF solution in an act 922. In some cases, the magnetostrictive film does not include an oxide or is otherwise not damaged as a result of the ion bombardment process. Whether the act 920 is implemented or modified may thus depend on the material composition of the magnetostrictive film and/or the substrate.

The method 900 may include an act 924 in which one or more electrodes or contacts (e.g., platinum contacts) are deposited. For example, a backside contact may be deposited on the piezoelectric substrate. The contact(s) may be formed via a sputtering procedure in combination with additional photolithography. In some cases, the backside contact may act as a gate of a switch or other device. Any number of device components or elements may be deposited or otherwise formed.

The method 900 may include fewer, additional, or alternative acts. For example, the method 900 may include one or more acts directed to cleaning or otherwise preparing the piezoelectric substrate. In some cases, the cleaning may include heating the substrate to a temperature (e.g., 375 degrees Celsius). A number of acts may also be implemented to form additional layers or other device elements. For instance, the method 900 may include one or more acts directed to depositing a capping layer, such as a titanium capping layer (e.g., a layer having a thickness of about 5 nm), following the deposition and cooling of the iron-gallium film.

Described above are composite multiferroic heterostructures and devices that provide magnetoelectric transduction at magnetostriction performance levels 200-1000% higher than those achieved using bulk samples. Methods of fabricating such heterostructures and devices utilize thin film epitaxy to stabilize a chemically disordered BCC iron-gallium alloy. Transport-based magnetoelectric characterization has shown 90° electrical switching of magnetic anisotropy and a room temperature converse magnetoelectric coefficient of $5.5 \times 10^{-6} - 2.0 \times 10^{-5}$ s m'.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A heterostructure comprising:
   a substrate exhibiting a piezoelectric effect; and
   a magnetostrictive film supported by the substrate;
   wherein the magnetostrictive film comprises an iron-gallium alloy, and wherein the iron-gallium alloy has a gallium composition greater than 20%, and
   wherein the iron-gallium alloy is arranged in A2 crystalline phase.

2. The heterostructure of claim 1, further comprising a buffer layer disposed between the substrate and the magnetostrictive film, wherein the buffer layer comprises iron.

3. The heterostructure of claim 1, wherein the gallium composition is less than about 30%.

4. The heterostructure of claim 1, wherein the iron-gallium alloy is single-phase.

5. The heterostructure of claim 1, wherein the iron-gallium alloy is arranged in single crystalline form.

6. The heterostructure of claim 1, wherein the substrate comprises a ferroelectric material.

7. The heterostructure of claim 1, wherein the substrate comprises $(1-x)PbMg_{1/3}Nb_{2/3}O_3-(x)PbTiO_3$.

8. The heterostructure of claim 1, wherein the substrate is a uniform, piezoelectric substrate.

9. A device comprising:
   a substrate comprising a first surface and a second surface opposite the first surface, the substrate exhibiting a piezoelectric effect;
   a conductive element disposed along the first surface of the substrate, the conductive element comprising a magnetostrictive film, the magnetostrictive film being patterned to define a lateral extent of the conductive element; and
   a contact disposed along the second surface and positioned in accordance with the lateral extent of the conductive element to define a voltage across the substrate that correlates with a strain along the first surface for coupling to the conductive element;
   wherein the magnetostrictive film comprises an iron-gallium alloy, and wherein the iron-gallium alloy has a gallium composition greater than 20%, and
   wherein the iron-gallium alloy is single-phase.

10. The device of claim 9, wherein the conductive element comprises a current channel of a switch arrangement such that the contact is configured to operate as a gate of the switch arrangement.

11. The device of claim 9, further comprising a voltage source coupled to the conductive element and configured to establish a magnetization resonance condition via the magnetostrictive film.

12. The device of claim 9, wherein the gallium composition is less than about 30%.

13. The device of claim 9, wherein the iron-gallium alloy is arranged in single-crystalline, A2 phase.

14. The device of claim 9, further comprising a buffer layer disposed at the first surface between the substrate and the magnetostrictive film, wherein the buffer layer comprises iron.

15. The device of claim 9, wherein the substrate is a uniform, piezoelectric substrate.

16. A method of fabricating a heterostructure, the method comprising:
   providing a substrate, the substrate exhibiting a piezoelectric effect; and
   growing epitaxially a magnetostrictive film, such that the magnetostrictive film is supported by the substrate, the magnetostrictive film comprising an iron-gallium alloy;
   wherein growing the magnetostrictive film comprises supplying an iron flux and a gallium flux to the substrate such that the iron-gallium alloy has a gallium composition greater than 20%.

17. The method of claim 16, further comprising:
   patterning the magnetostrictive film via an ion bombardment process, the ion bombardment process damaging an oxide layer of the magnetostrictive film; and
   removing the damaged oxide layer of the magnetostrictive film with an acidic solution.

18. The method of claim 16, further comprising depositing, on the substrate, a buffer layer on which the magnetostrictive film is grown.

19. The method of claim 16, wherein the gallium composition is less than about 30%.

20. The method of claim 16, wherein growing the magnetostrictive film is implemented such that the iron-gallium alloy is arranged in single crystalline form.

21. The method of claim 16, wherein providing the substrate comprises fabricating a composite substrate, the composite substrate comprising a piezoelectric layer.

\* \* \* \* \*